(12) United States Patent
Davidson et al.

(10) Patent No.: US 6,476,774 B1
(45) Date of Patent: *Nov. 5, 2002

(54) COMPOSITE INJECTION MOULDABLE MATERIAL

(75) Inventors: Brian Davidson, Working (GB); Jeff Mabbott, Camberley (GB); Joseph Modro, Baybridge Owlslebury (GB); Robert Millea, South Ruislip (GB)

(73) Assignee: Nokia Mobile Phones Limited, Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/355,018
(22) PCT Filed: Jul. 16, 1999
(86) PCT No.: PCT/EP99/03714
§ 371 (c)(1), (2), (4) Date: May 12, 2000
(87) PCT Pub. No.: WO99/62841
PCT Pub. Date: Dec. 9, 1999

(30) Foreign Application Priority Data

May 29, 1998 (GB) ............................................ 98116643
Dec. 23, 1998 (GB) ............................................ 98285323

(51) Int. Cl.[7] ................................................. B32B 5/16
(52) U.S. Cl. ....................................... 343/895; 428/325
(58) Field of Search ........................... 343/895, 700 MS; 156/150, 153; 428/325, 402

(56) References Cited

U.S. PATENT DOCUMENTS

| | | | |
|---|---|---|---|
| 4,772,653 A | 9/1988 | McKenna | 524/427 |
| 5,154,973 A | 10/1992 | Imagawa et al. | 428/325 |
| 5,380,386 A * | 1/1995 | Oldham et al. | 156/150 |
| 6,127,989 A * | 10/2000 | Kunz | 343/895 |

FOREIGN PATENT DOCUMENTS

| | | |
|---|---|---|
| EP | 123954 A2 | 11/1984 |
| EP | 420619 A2 | 4/1990 |
| GB | 2214512 A | 9/1989 |
| JP | 6363728 | 3/1988 |
| JP | 4197718 | 7/1992 |
| JP | 51229 | 1/1993 |

* cited by examiner

*Primary Examiner*—Don Wong
*Assistant Examiner*—James Clinger
(74) *Attorney, Agent, or Firm*—Antonelli, Terry, Stout & Kraus, LLP

(57) ABSTRACT

An injection mouldable material and a method of making the material wherein the material comprises a mixture of an injection-mouldable polymer and a dielectric substance having a relatively high dielectric constant. The dielectric substance is preferably a ceramic. Such material is particularly suitable for the manufacture of planar antennas. The polymer preferably has a loss tangent equal to or less than 0.01 and greater than or equal to 0.002.

26 Claims, 3 Drawing Sheets

COMPOSITE INJECTION MOULDABLE MATERIAL

CROSS-REFERENCE TO RELATED APPLICATION

This is a 371 of international application PCT/EP99/03714, with an international filing date of May 28, 1999.

BACKGROUND OF THE INVENTION

The present invention relates to composite injection mouldable material and in particular to platable injection mouldable material having a relatively high dielectric constant and low dielectric loss.

Applications such as RF (Radio Frequency) applications require devices having a high dielectric constant and a low dielectric loss. It is known to use metallised ceramic components for these applications, produced using established technology to cast and fire the ceramic. However, the machining of these components is generally difficult and only simple planar structures are possible. Metallisation to form interconnection and tracking is also a specialist activity and the resulting components tend to be heavy.

Composites of polytetrafluoroethylene (PTFE) and ceramic have found increasing use in similar applications. The composite is more easily machined and patterned than ceramics. However, it is may only be made in sheet form.

SUMMARY OF THE INVENTION

In accordance with a first aspect of the invention an injection mouldable material comprises a composite of an injection-mouldable polymer and a ceramic filler.

Preferably the loss tangent of the polymer is equal or less than 0.010 (which corresponds to a Q of 100) and greater than or equal to 0.002 (which corresponds to a Q of 500) at 1 GHz. Preferably these characteristics are maintained for frequencies up to 2.5 GHz.

In accordance with a second aspect of the invention an injection mouldable material comprises a composite of an injection-mouldable polymer and a filler having a dielectric constant of at least 9.

Thus the invention enables the production of devices requiring a high dielectric constant and low loss, which are light and capable of being injection moulded. Complex 3D structures may be constructed which may be plated, preferably using Moulded Interconnection Device (MID) technology.

The filler is chosen to have a high dielectric constant compared with the polymer and low dielectric loss. A dielectric constant in the range of 9–250 is contemplated for the filler.

The material has a relatively high dielectric constant which allows a reduction in the physical size of RF devices such as antennas. This has particular application to internal antennas where market forces are demanding ever smaller devices. In addition a material having a high dielectric constant allows better control of field patterns, thus making devices more directional and efficient. The low dissipation factors of the material also minimise the energy loss in the device structure and hence maximise the energy radiated.

Preferably the polymer is polyetherimide and the filler is a ceramic. Another particularly suitable polymer is SPS (synthiotactic polystyrene). These polymers are chosen for their good plate-ability characteristics.

The filler may have a dielectric constant of at least 9.8, preferably at least 30 or 100. Preferably the filler is Titanium, Ba—Ti or Alumina.

Advantageously the filler may comprise at least 10% by weight of the material and preferably at least 30% to 60% by weight of the material. Clearly the higher the percentage of the filler, the higher the dielectric constant of the composite material will be. The amount of filler which may be used is generally limited by the mechanical properties of the resulting material e.g. polyetherimide with more than 60% Titania may become too brittle or not suitable for injection moulding.

Devices formed of a material according to the invention are thus lighter than prior known devices formed from ceramic and may be formed into complex structures. The material is particularly suitable for the manufacture of antennas although it is suitable for many other high frequency applications.

In a further aspect of the invention, a method of manufacturing a composite material comprises mixing a ceramic substance with an injection-mouldable polymer, heating the mixture and extruding the composite material.

Preferably the ceramic substance is in a powdered form and the polymer is in a granulated form.

In a yet further aspect of the invention, a method of manufacturing a device comprises injection moulding material comprising a composite of an injection-mouldable polymer and a ceramic substance to form the device.

In a yet further aspect of the invention there is provided an antenna formed from a material comprising an injection mouldable polymer and a ceramic substance. Such an antenna is particularly suitable for use with portable communication devices, for example radio telephones, etc.

BRIEF DESCRIPTION OF THE DRAWINGS

The invention will now be described, by way of example only, with reference to the accompanying drawings in which.

DETAILED DESCRIPTION OF THE INVENTION

The material comprises a composite of an injection-mouldable polymer and a filler having a dielectric constant which is relatively high compared with that of the polymer. One embodiment of the material comprises a composite of polyetherimide and a ceramic. Polyetherimide is available from GE Plastics in the Netherlands under the brand name Ultem. Polyetherimide was chosen since it is an amorphous material which is readily platable. It has good dimensional stability (low creep and coefficient of thermal expansion), chemical resistance suitable for plating and is stable to high temperatures. In addition polyetherimide has a relatively high dielectric constant (2.9) and a low loss tangent (0.0025 at 1 GHz) for a polymer. Other injection mouldable polymers may be used.

The filler has a dielectric constant which is relatively high compared with that of the polymer. Table 1 shows the dielectric constant and loss tangent for four ceramics.

TABLE 1

| Ceramic | Chemical Name | Dielectric constant | Loss tangent |
|---|---|---|---|
| DA-9 | Alumina | 9.8 | 0.0001 |
| D-38 | Ba—Ti | 37.0 | 0.0005 |
| D-8800 | Ba—Ti | 38.6 | 0.0002 |
| D-100 | Titania | 100.0 | 0.0010 |

These ceramics are available from Trans-tech Inc of the USA. The ceramic is in the form of fully fired spherical powder having a 325 mesh (0.044mm) particle size.

Table 2 shows the resulting dielectric constant of the composite material for given loadings of the polymer with each of the four ceramics of Table 1.

TABLE 2

| | dielectric constant | | | | | |
|---|---|---|---|---|---|---|
| | By Weight | | | | | |
| Filler | 10% | 15% | 25% | 30% | 35% | 60% |
| None | | | | 2.7 | | |
| DA-9 | 3.20 | | | 3.50 | 3.76 | 4.38 |
| D-38 | 3.22 | | 3.89 | 4.05 | | 6.93 |
| D-8800 | 3.30 | | | 4.03 | | 7.44 |
| D-100 | 3.23 | 3.66 | | 4.81 | | 10.21 |

As can be seen from Table 2, when the ceramic makes up only 10% of the material, the dielectric constant of the composite material is significantly improved compared with the unloaded polymer. Clearly higher dielectric constants are achieved with higher percentages of the filler.

Table 3 shows the resulting dielectric loss of the composite material for a given loading of the material with each of the four ceramics of Table 1.

TABLE 3

| | loss tangent | | |
|---|---|---|---|
| | By Weight | | |
| Filler | 10% | 30% | 60% |
| None | | 0.0025 | |
| DA-9 | 0.0001 | 0.0007 | |
| D-38 | 0.0001 | 0.0008 | 0.0007 |
| D-8800 | 0.0012 | 0.0008 | 0.0008 |
| D-100 | 0.0007 | 0.0015 | 0.0030 |

Although loss figures are difficult to measure and may be inaccurate, overall the figures show a reduction in loss compared with the polymer itself. Testing at 1 MHz and 1 GHz gave similar results for both the dielectric constant and the loss.

Figure 1:
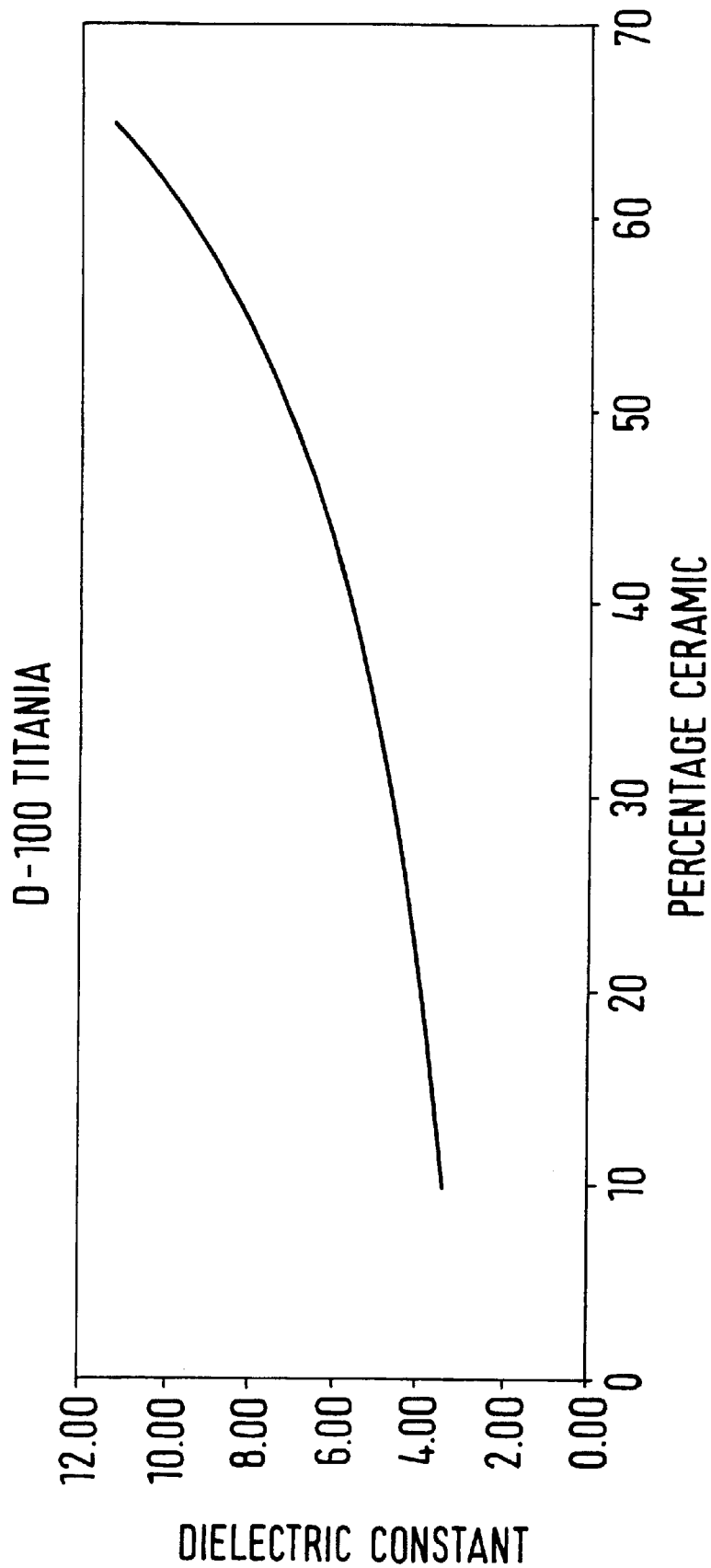
FIG. 1 shows the dielectric constant of one embodiment of the material for differing percentages of Titania.

The preferred composite tested was polyetherimide with 60% b.w Titania (D-100). FIG. 1 shows the expected dielectric constant of the composite material for different percentages (by weight) of Titania.

Plating tests were carried out on the resulting composite materials. Using standard plating processes, all composite materials plated successfully with varying levels of adhesion and surface appearance. The higher percentage filled materials showed the best adhesion.

Table 4 shows the density of the composite materials in g/cm$^3$. The density of the ceramics themselves ranged between 4.0 and 4.7.

TABLE 4

| | density | | | | | |
|---|---|---|---|---|---|---|
| | By weight | | | | | |
| Filler | 10% | 15% | 25% | 30% | 35% | 60% |
| Ultem | | | 1.27 | | | |
| DA-9 | 1.39 | | | 1.63 | 1.70 | 2.18 |
| D-38 | 1.40 | | 1.58 | 1.65 | | 2.27 |
| D-8800 | 1.40 | | | 1.66 | | 2.30 |
| D-100 | 1.39 | 1.45 | | 1.63 | | 2.18 |

Figure 2:
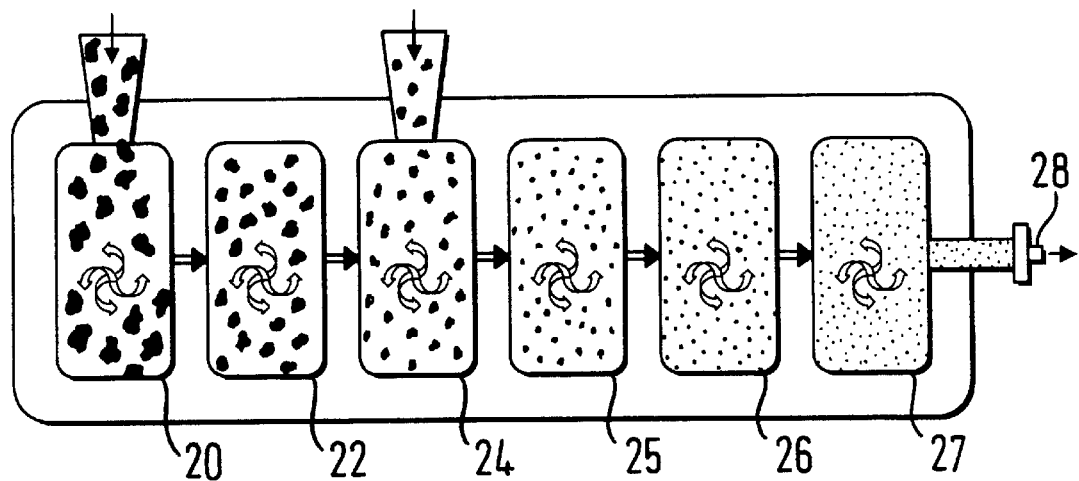
FIG. 2 shows an example of production apparatus for producing material according the invention.

The material may be made using conventional kneading and extruding processes as shown in FIG. 2. The polymer is introduced into a first kneading chamber 20 which breaks down the granular polymer into smaller particles. These are then passed into a second chamber 22 which heats and kneads the polymer into even smaller particles. The ceramic powder is then added into a third chamber 24 and the composite material is passed through three more chambers 25, 26, 27 where it is heated and kneaded to form an evenly distributed composite material which is then extruded as a bar of material through outlet 28. The bar is then cooled. The composite material output from the apparatus of FIG. 2 may be processed further e.g. formed into portions of a size suitable for their intended use.

Other materials may be added, for instance into chamber 25, to impart other desired mechanical properties to the material.

Figure 3:
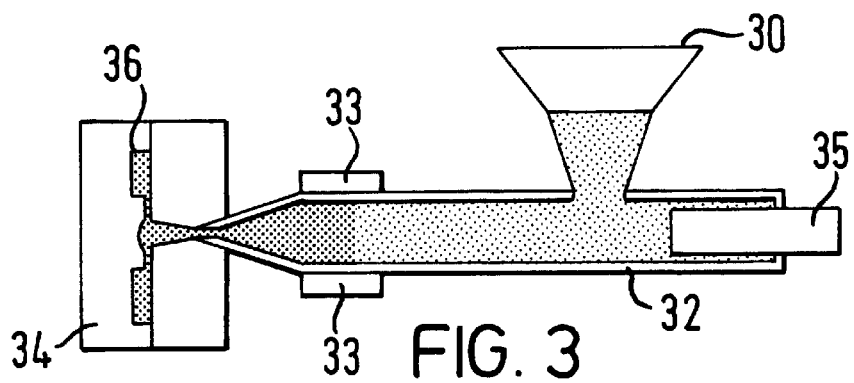
FIG. 3 shows an example of injection moulding apparatus for use with material according to the invention.

FIG. 3 shows an example of the injection moulding process. In this case, the composite material has been formed into chips. The composite is introduced via inlet 30 into an injection nozzle 32. The powder is heated by heating element 33 and transferred to a mould 34 under pressure supplied by a piston 35. The soft material in the cavity 36 of the mould cools rapidly and can be quickly ejected.

The material is suitable for any device requiring a high dielectric constant and low dielectric loss. It is particularly suitable for use in the manufacture of antennas, the high dielectric constant providing a closer near field. By increasing the dielectric constant of the material, which results in a reduced electrical length, smaller devices can be made.

Figure 4:
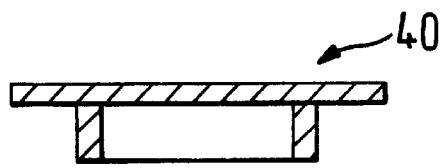
FIG. 4 shows an example of a planar antenna formed of material according to the invention.

The material has many potential applications. For example the material is particularly suitable for planar antennas (for instance as used in mobile portable telephones); 2D and 3D microwave and RF circuit boards; multichip technology; RF and microwave cables and couplings; loop, satellite and GPS antennas; and base station antennas. FIG. 4 shows an example of an injection moulded planar antenna 40 formed of material according to the invention.

Figure 5:
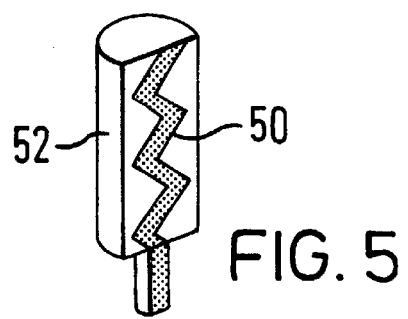
FIG. 5 shows an example of an antenna having a conductive filament disposed on a support formed of material according to the invention.
Figure 6:
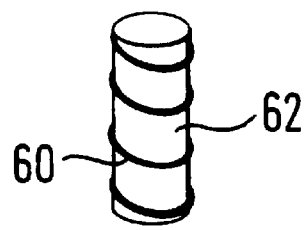
FIG. 6 shows an example of a helical antenna having a core formed of material according to the invention.

The material may be used to form a supporting core for a helical antenna or for a flat linear antenna. FIG. 5 shows an example of an antenna having a conductive filament 50 disposed on a support 52 formed of material according to the invention. FIG. 6 shows an example of a helical antenna 60 having a core 62 formed of material according to the invention. Further examples of such antennas may be found in UK patent no. 1367232 and European patent application no. 0198578.

Figure 7:
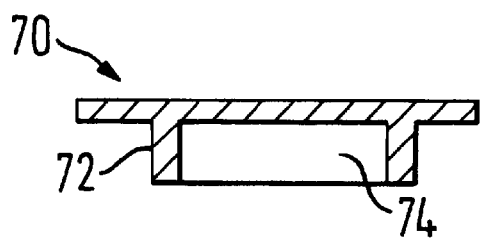
FIG. 7 shows another example of an injection moulded planar antenna.

Owing to the injection-mouldable nature of the material, complex 3D structures can be produced e.g. to act as internal antennas. FIG. 7 shows an example of a planar antenna 70 (e.g. of the so-called PIF type). The antenna 70 comprises a moulded structure 72 which includes air pockets 74. The combination of air 74 and material 72 allows a designer to change the effective dielectric constant of the antenna. Thus antennas may be of the same size but have different effective dielectric constants. This is particularly attractive to device manufacturers where a single casing may be used to house devices of differing capabilities.

Figure 8:
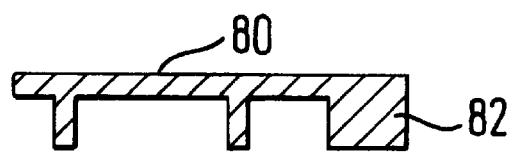
FIG. 8 shows an example of an injection moulded antenna having a capacitive load.

FIG. 8 shows another example of an antenna in which the planar antenna 80 is moulded to have a capacitive load 82 at one end. This allows the resonant frequency of the antenna to be tuned.

Figure 9:
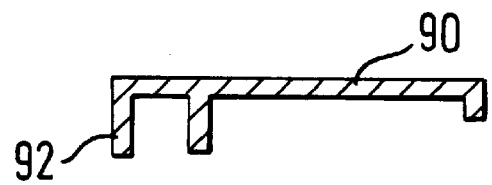
FIG. 9 shows an example of an injection moulded antenna having a protective shield at one edge of the antenna.

The antenna structure may be moulded with a concentration of the material in a particular place. For instance, FIG. 9 shows an antenna 90 having a skirt 92 of the material around one end of the antenna to control and direct the radiation field of the antenna. In the embodiment shown in FIG. 9, the radiation field is concentrated around the antenna and hence the amount of radiation from the antenna directed towards components to the left of the antenna as viewed in FIG. 9 is reduced.

By moulding the antenna and its structure from a high dielectric material it is possible to design the shape of the antenna to affect and control the radiation field patterns. This can be used to reduce the size of the antenna and the handset by reducing the effects of nearby components and absorptive structures. The high dielectric material increases the effective space between the antenna and nearby components, thereby allowing them to be brought closer together without detrimental effect.

The material may be used to form microwave or RF circuit boards. The material may also be used to mould RF and microwave cables and couplings either separately from or directly attached to circuit boards or enclosures. The material may also be used to form reduced-volume antennas for satellite, base station and GPS antennas.

The material may also be used to form devices such as dielectric resonators, filters etc.

Generally the material will find applications in most high frequency applications. The above examples are not intended to limit the applications for which the material of the invention is suitable.

What is claimed is:

1. An injection mouldable material suitable for forming an antenna, said injection mouldable material comprising:
    a composite of a platable, injection-mouldable polymer and a ceramic substance.

2. An injection mouldable material according to claim 1 wherein the polymer has a loss tangent equal or less than 0.01.

3. An injection mouldable material according to claim 1 wherein the polymer has a loss tangent equal or greater than 0.002.

4. An injection mouldable material according to claim 1 wherein the polymer has a loss tangent substantially equal to 0.0025.

5. An injection mouldable material according to claim 1 wherein the polymer is polyetherimide.

6. An injection mouldable material according to claim 1 wherein the ceramic has a dielectric constant of at least 9.8.

7. An injection mouldable material according to claim 1 wherein the ceramic has a dielectric constant of at least 9.8.

8. An injection mouldable material according to claim 1 wherein the ceramic has a dielectric constant of at least 30.

9. An injection mouldable material according to claim 1 wherein the ceramic has a dielectric constant of at least 100.

10. An injection mouldable material according to claim 1 wherein the ceramic comprises at least 10% by weight of the material.

11. An injection mouldable material according to claim 1 wherein the ceramic comprises at least 30% by weight of the material.

12. An injection mouldable material according to claim 1 wherein the ceramic comprises at least 60% by weight of the material.

13. An injection mouldable material according to claim 2, wherein the polymer has a loss tangent equal or greater than 0.002.

14. An injection mouldable material suitable for forming an antenna, said injection mouldable material comprising:
    a composite of a platable, injection-mouldable polymer and a substance having a dielectric constant of at least 9.

15. An injection mouldable material according to claim 14 wherein the substance is a ceramic.

16. An antenna comprising:
    an injection mouldable material suitable for forming an antenna, said injection mouldable material comprises:
    a composite of a platable, injection-moulded polymer and a ceramic substance.

17. An antenna according to claim 16 wherein said antenna is of the planar type.

18. An antenna comprising:
    a core included within said antenna of an injection mouldable material suitable for forming an antenna, said injection mouldable material comprises:
    a composite of a platable, injection-mouldable polymer and a ceramic substance.

19. An antenna comprising:
    a conductive filament disposed of a support,
    wherein the support is formed of an injection mouldable material suitable for forming an antenna, said injection mouldable material comprises:
    a composite of a platable, injection-mouldable polymer and a ceramic substance.

20. A method of manufacturing an antenna, said method comprising:
    an injection moulding material comprising a composite of a platable, injection-mouldable polymer having a loss tangent equal or less than 0.01 and greater than or equal to 0.002 and a ceramic substance to form the device.

21. An injection moulded antenna comprising:
    a planar sheet of injection mouldable material, said injection mouldable material comprises:
    a composite of a platable, injection-mouldable polymer and a ceramic substance, and a skirt at at least one edge of the sheet to prevent radiation from leaking in the direction of the skirt.

22. An injection mouldable material suitable for forming an antenna, said injection mouldable material comprising:
    a composite of a platable, injection-mouldable polymer and a ceramic substance, wherein the ceramic substance is a ceramic powder.

23. The injection mouldable material of claim 22, wherein the platable, injection-mouldable polymer is polyetherimide.

24. The injection mouldable material of claim 22 wherein the material has a dielectric constant of at least 3.20.

25. The injection mouldable material of claim 22 wherein the material has a dielectric constant of at least 3.50.

26. The injection mouldable material of claim 22 wherein the material has a dielectric constant of at least 4.48.

* * * * *